(12) United States Patent
Chen et al.

(10) Patent No.: US 7,780,456 B2
(45) Date of Patent: Aug. 24, 2010

(54) ELECTRICAL CONNECTOR HAVING REINFORCED CONTACTS ARRANGEMENT

(75) Inventors: Ming-Yue Chen, Tu-Cheng (TW); Shih-Wei Hsiao, Tu-Cheng (TW); Ke-Hao Chen, Tu-Cheng (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 12/535,370

(22) Filed: Aug. 4, 2009

(65) Prior Publication Data

US 2010/0029102 A1 Feb. 4, 2010

(30) Foreign Application Priority Data

Aug. 4, 2008 (TW) .............................. 97213891 A (51) Int. Cl.
*H01R 12/00* (2006.01)
(52) U.S. Cl. ..................................... 439/66; 439/733.1
(58) Field of Classification Search ................. 439/66, 439/74, 733.1, 862
See application file for complete search history.

(56) References Cited

U.S. PATENT DOCUMENTS 1,477,527 A * 12/1923 Raettig ....................... 200/282
6,615,485 B2 * 9/2003 Eldridge et al. ................ 29/843
6,645,012 B2 * 11/2003 Ito et al. ...................... 439/637
7,182,634 B2 * 2/2007 Tran ............................ 439/539
7,341,485 B2 * 3/2008 Polnyi ........................ 439/591
7,549,871 B2 * 6/2009 Pennypacker et al. ......... 439/66

* cited by examiner

*Primary Examiner*—Thanh-Tam T Le
(74) *Attorney, Agent, or Firm*—Andrew C. Cheng; Wei Te Chung; Ming Chieh Chang (57) ABSTRACT

An electrical connector comprises an insulative housing having a plurality of passageways, and a number of contacts receiving in corresponding passageways, respectively. The contacts comprises a first base portion having a first retaining portion for securing the contact in the passageway, and a second base portion having a second resilient arm extending therefrom. A first resilient arm extends upwardly from the first base portion and having a contacting portion disposed at a free end thereof. The second base portion and the second resilient arm are attached to the first base portion and the first resilient arm, respectively, from a lower position. Accordingly, an electrical connector with a large array pattern of the contacts is achieved under a condition that steady electrical connection is provided.

9 Claims, 11 Drawing Sheets

ELECTRICAL CONNECTOR HAVING REINFORCED CONTACTS ARRANGEMENT

BACKGROUND OF THE INVENTION

1. Field of the Invention

The present invention relates to an electrical connector for electrically connecting an electronic package such as a microprocessor with a circuit substrate such as a printed circuit board (PCB), and more particularly to an electrical connector having reinforced contacts arrangement to enhance strength of the contacts.

2. Description of Prior Art

Land Grid Array (LGA) connector is widely used for establishing electrical connection between an electronic package, e.g. a Central Processing Unit (CPU), and a PCB, e.g. a motherboard. Contact of the LGA connector generally comprises a resilient arm for engaging with pad arranged on the CPU. Such LGA connector is typically illustrated in U.S. Pat. No. 7,044,746 issued to Copper on May 16, 2006. With the development of society, people have a higher need for capability of the CPU. Accordingly, LGA connector for connecting the CPU and the motherboard is requested to have a better performance. Additionally, to meet the industry trend of miniaturization of electric device, the connector is also requested to comply with a trend of miniaturization and multiple contact points.

Figure 1:
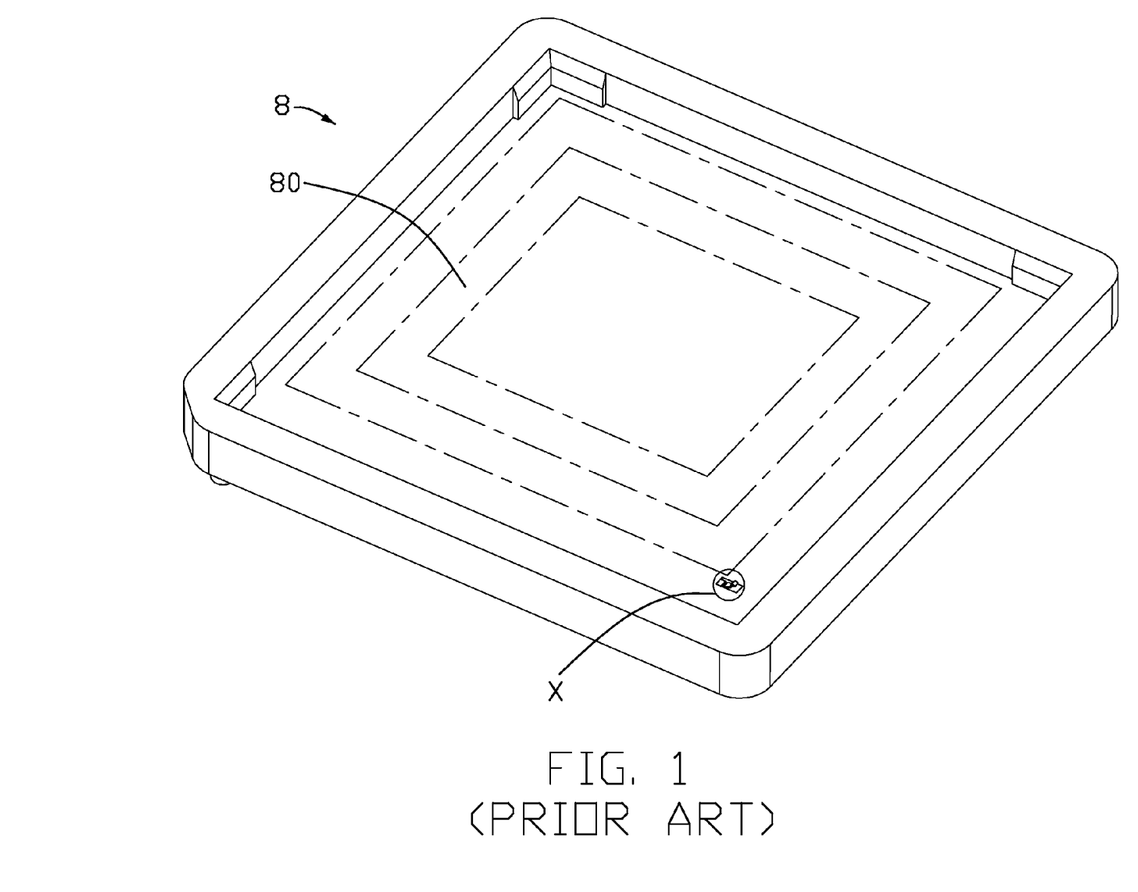
FIG. 1 is an isometric view of an electrical connector in accordance with a conventional design.
Figure 2:
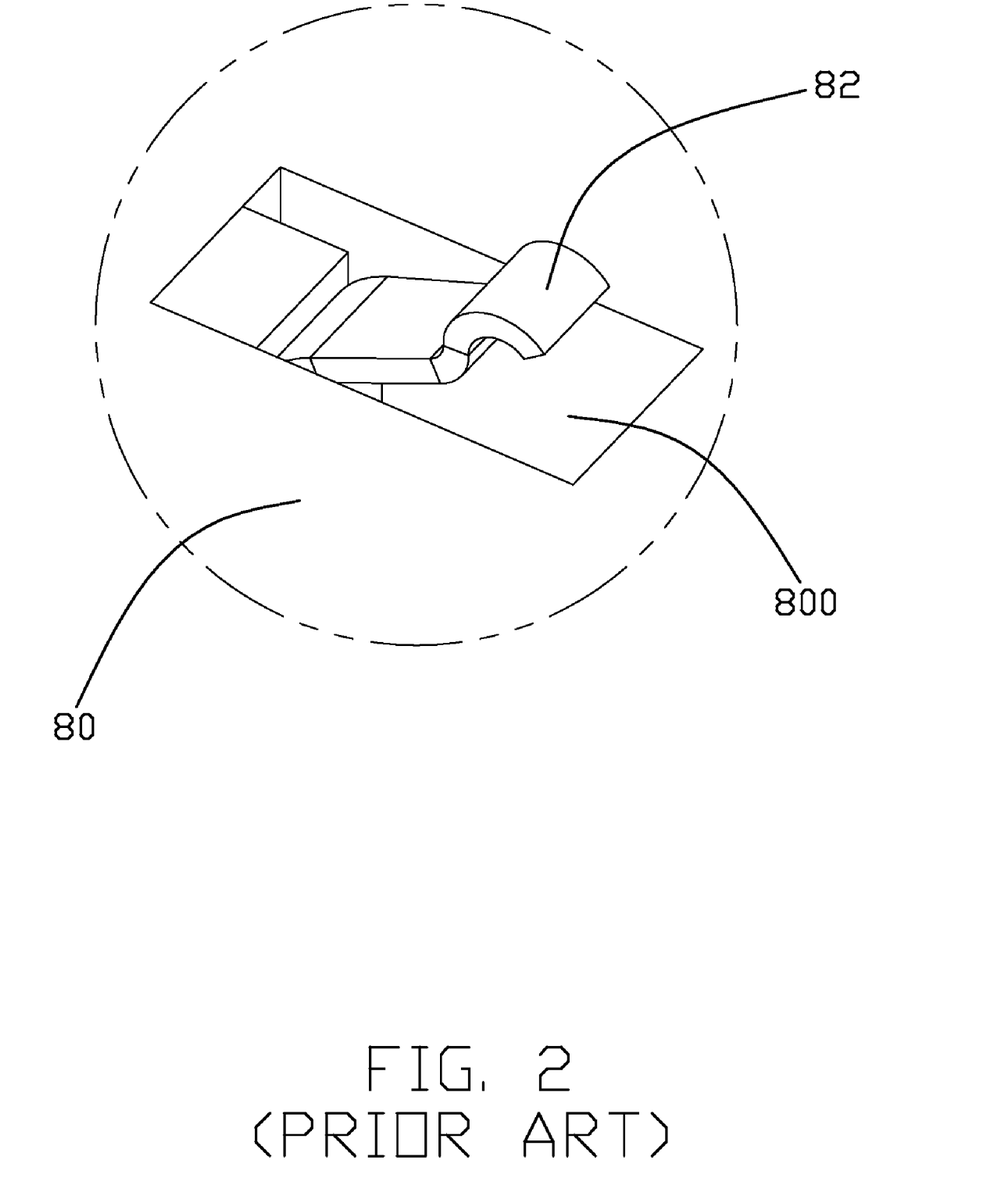
FIG. 2 is an enlarged view of the X portion of FIG. 1.
Figure 3:
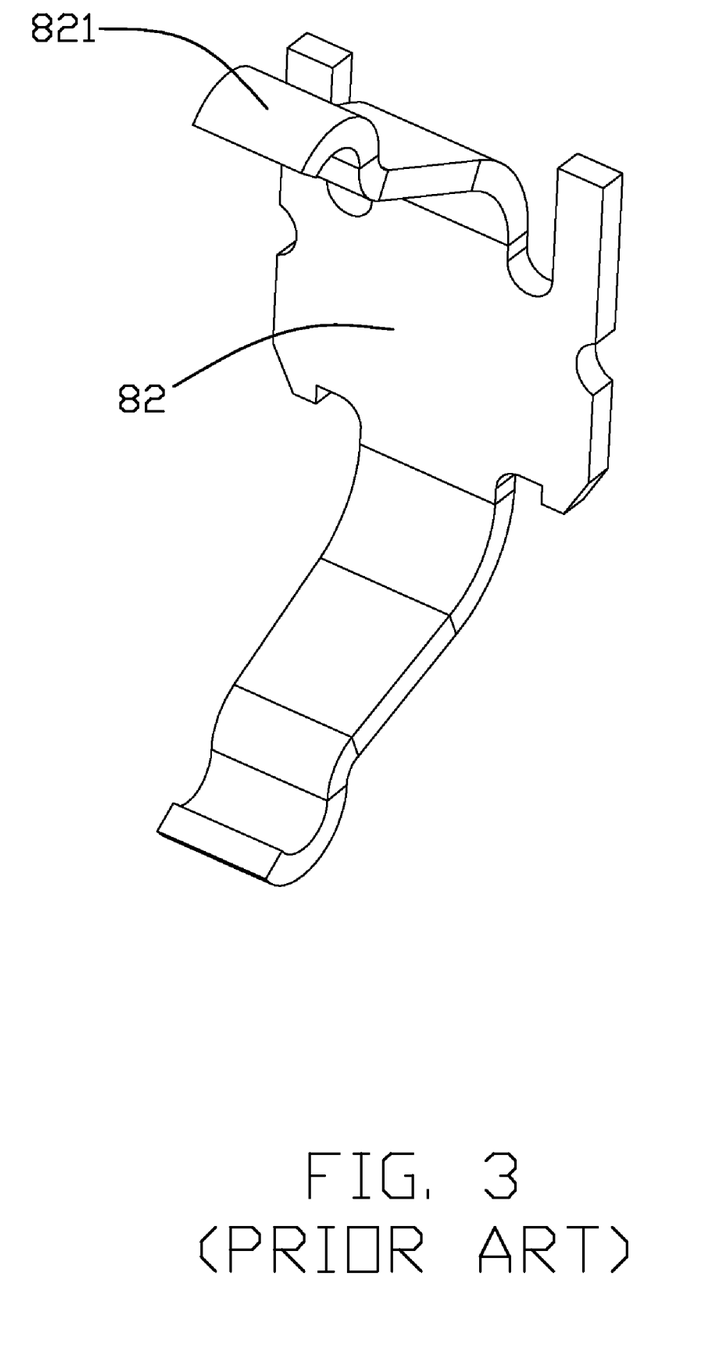
FIG. 3 is a perspective view of the electrical contact of FIG. 1.
Figure 4:
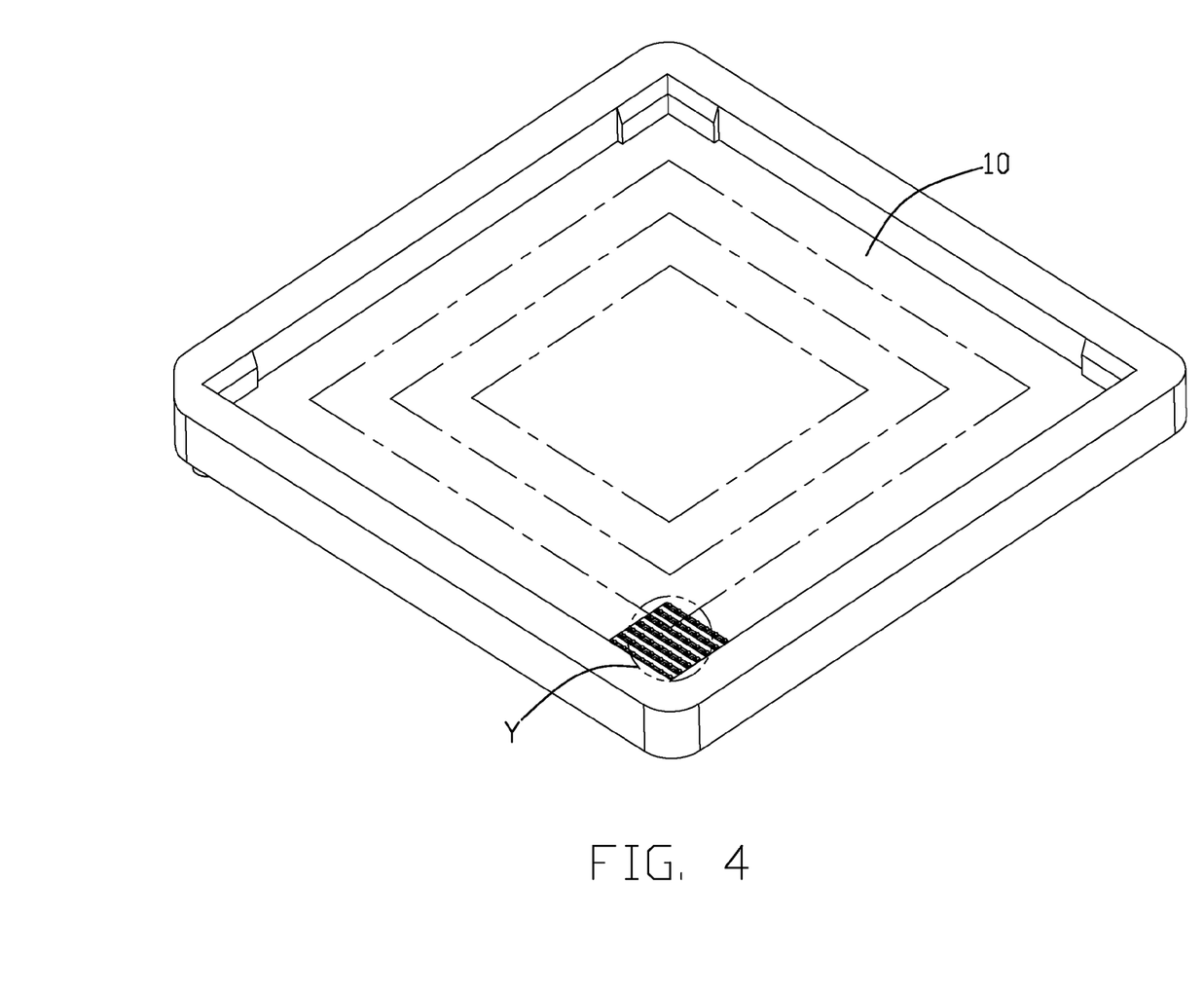
FIG. 4 is an isometric view of an electrical connector in accordance with the present invention.
Figure 5:
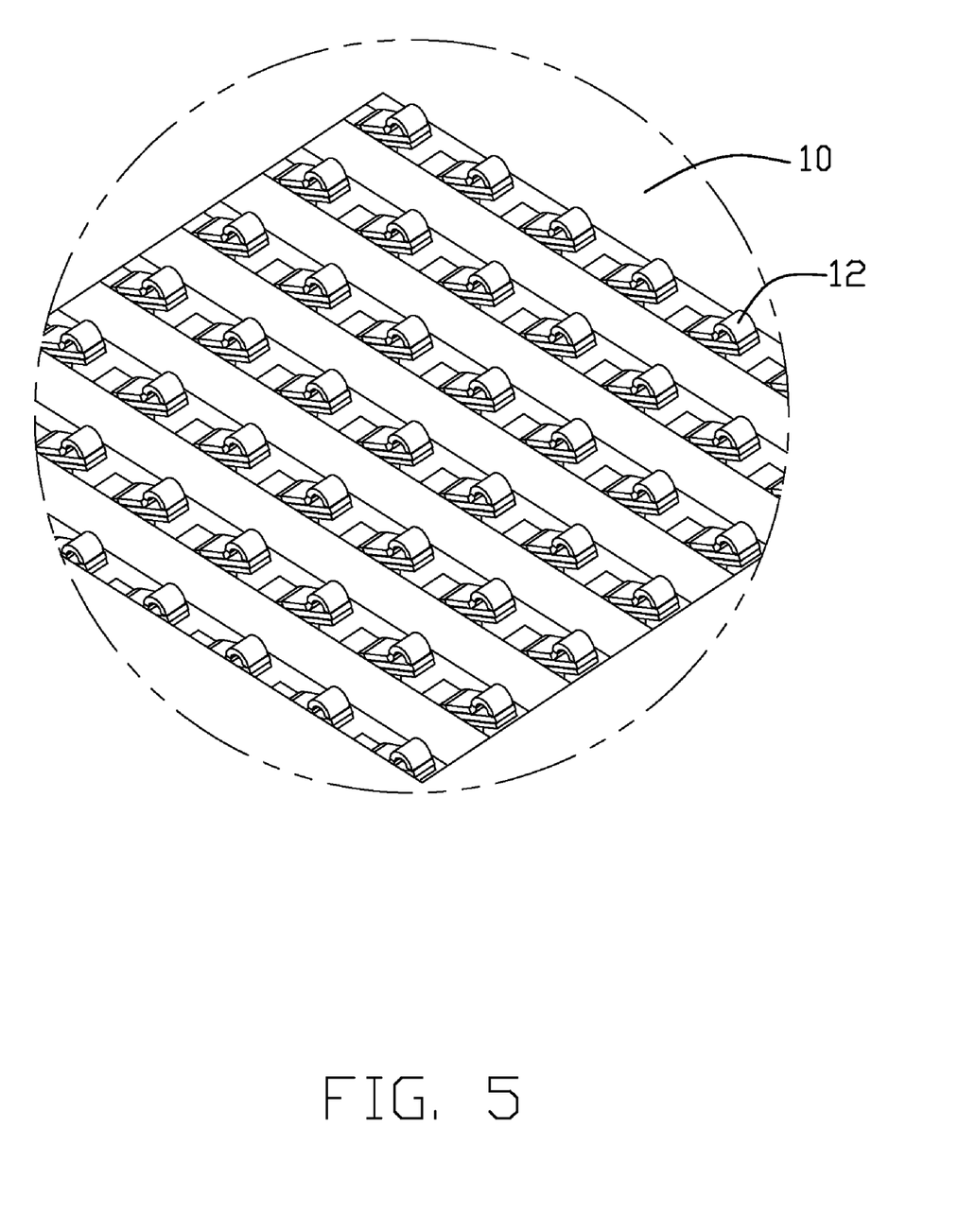
FIG. 5 is an enlarged view of the Y portion of FIG. 4.

FIGS. 1-3 describe an LGA connector 8 relating to the present invention, comprising an insulative housing having a plurality of passageways 800, a plurality of contacts 82 receiving in corresponding passageways 800, respectively. Each of the contacts 82 define a pair of arms 821 extending upwardly and downwardly.

The LGA connector 8 can not meet the need of trend of miniaturization and multiple contact points freely. In order to get a contact layout of miniaturization and multiple contact points, size of the contact 82 can be scaled down. Thus, the LGA connector 8 can contain more contacts without size increased. However, when the geometry of the contact 82 scales down, it is inevitably reduce the overall strength of the arm 821. It will be vulnerable to exceed its yielding point when a load is applied thereto, causing a permanent deformation of the contact arm 821. This will possibly cause the socket functionless as the contact arm 821 can not provide a sufficient normal force.

In view of the above, an improved electrical connector that overcomes the above-mentioned disadvantages is desired.

SUMMARY OF THE INVENTION

Accordingly, an object of the present invention is to provide an electrical connector for electrically connecting an electronic package such as a CPU with a circuit substrate such as a PCB, which can provide a large array pattern or group of arrays of the contacts under a condition that the contact has enough elasticity and strength.

To achieve the above-mentioned object, an electrical connector in accordance with a preferred embodiment of the present invention for electrically connecting an electronic package with a PCB is provided. An electrical connector comprises an insulative housing having a plurality of passageways, and a number of contacts receiving in corresponding passageways, respectively. The contacts comprises a first base portion having a first retaining portion for securing the contact in the passageway, and a second base portion having a second resilient arm extending therefrom. A first resilient arm extends upwardly from the first base portion and having a contacting portion disposed at a free end thereof. The second base portion and the second resilient arm are attached to the first base portion and the first resilient arm, respectively, from a lower position. By way above mentioned, the contact will maintain a sufficient elasticity even size reduced. Accordingly, an electrical connector with a large array pattern of the contacts is achieved under a condition that elasticity and strength of the contact is enough.

Other objects, advantages and novel features of the invention will become more apparent from the following detailed description when taken in conjunction with the accompanying drawings, in which:

DETAILED DESCRIPTION OF THE PREFERRED EMBODIMENT OF THE INVENTION

Reference will now be made to the drawings to describe the present invention in detail.

Referring to FIGS. 4-9, an electrical connector 1 in accordance with the preferred embodiment of the present invention is used for electrically connecting an electrical package (not shown) with a PCB (not shown). The connector 1 comprises an insulative housing 10 having a plurality of passageways 100, and a plurality of electrical contacts 12 received in corresponding passageways 100, respectively.

Figure 6:
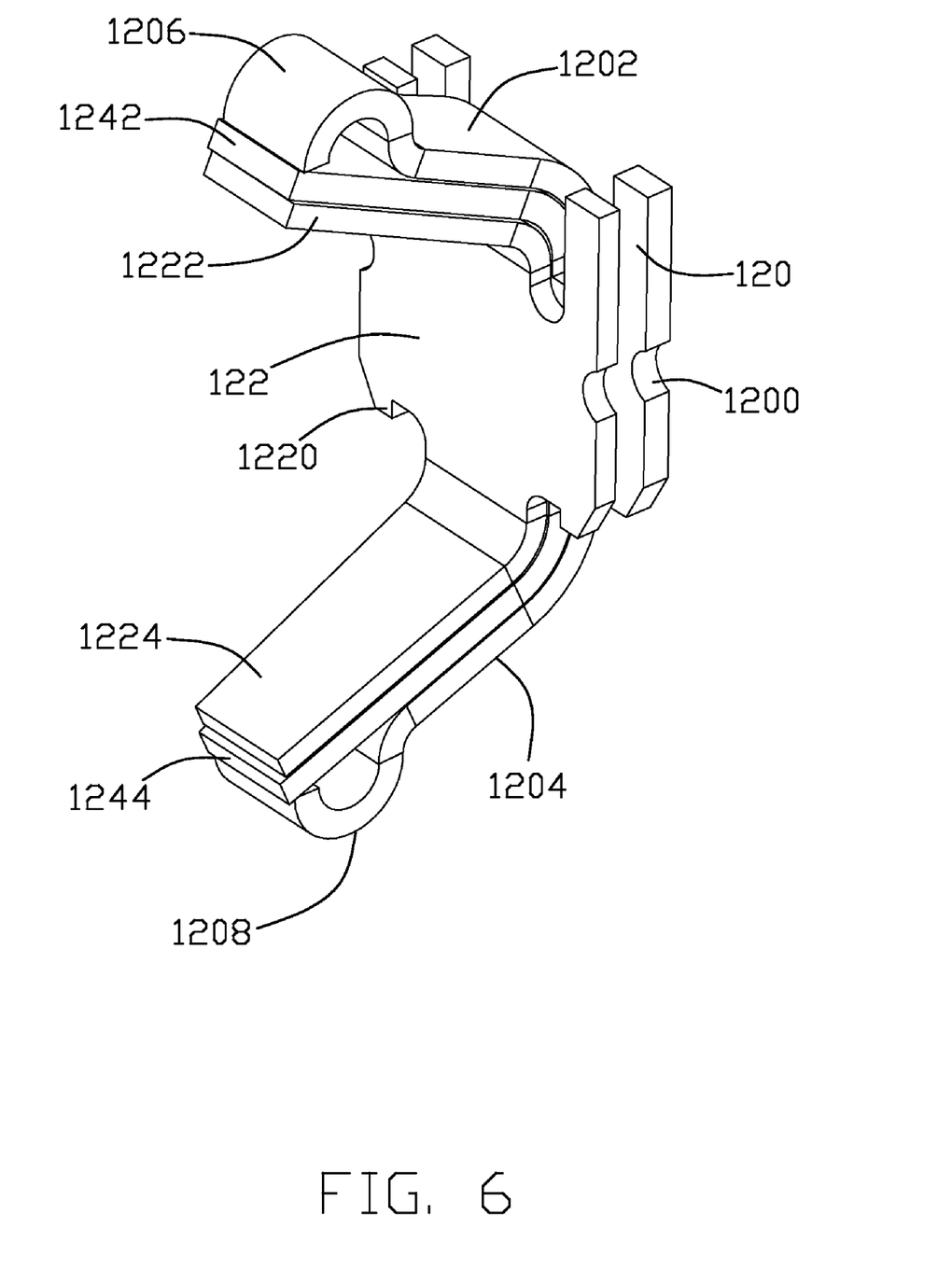
FIGS. 6-7 are assembled view and exploded view of the contact of the present invention, respectively.
Figure 7:
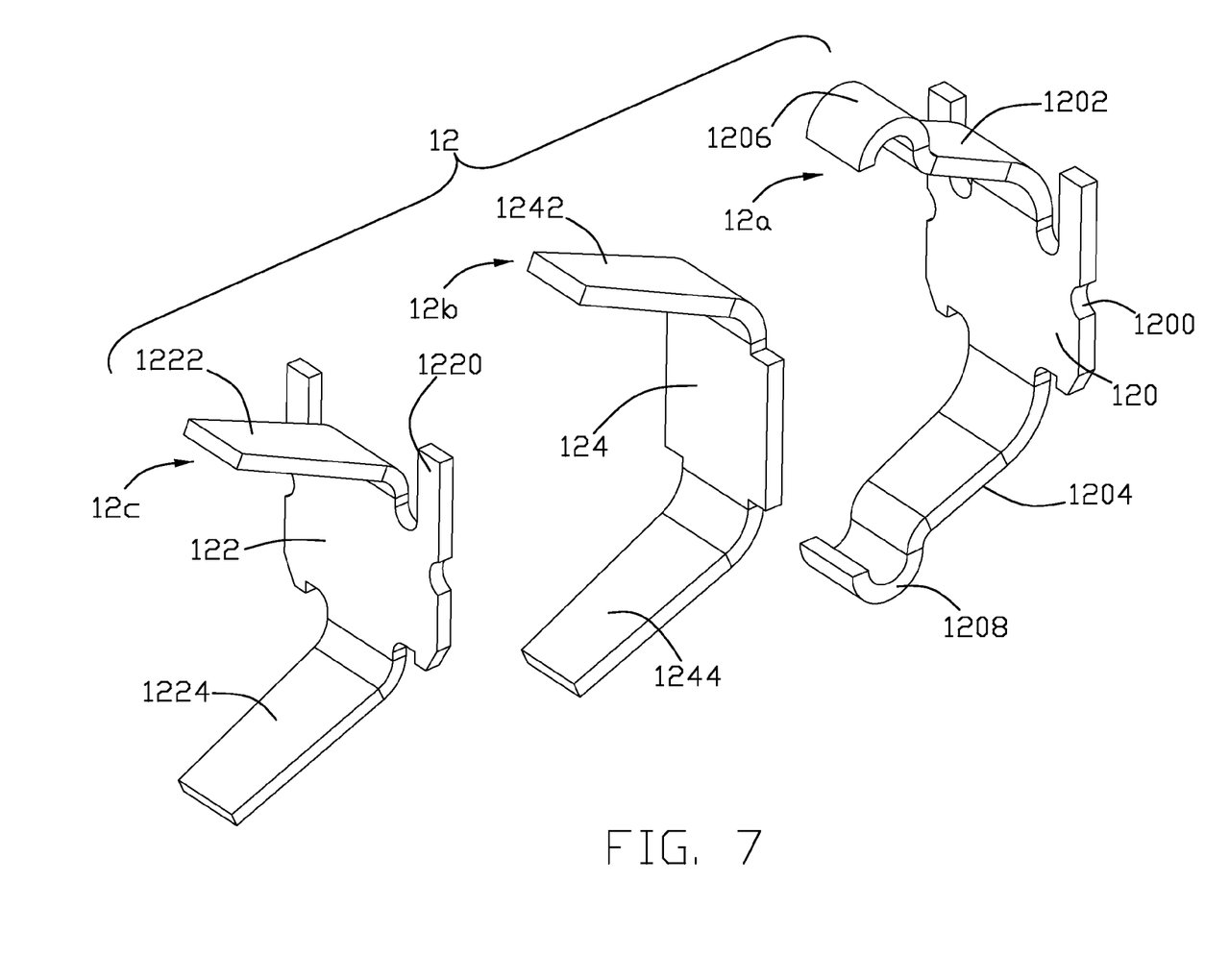
Figure 8:
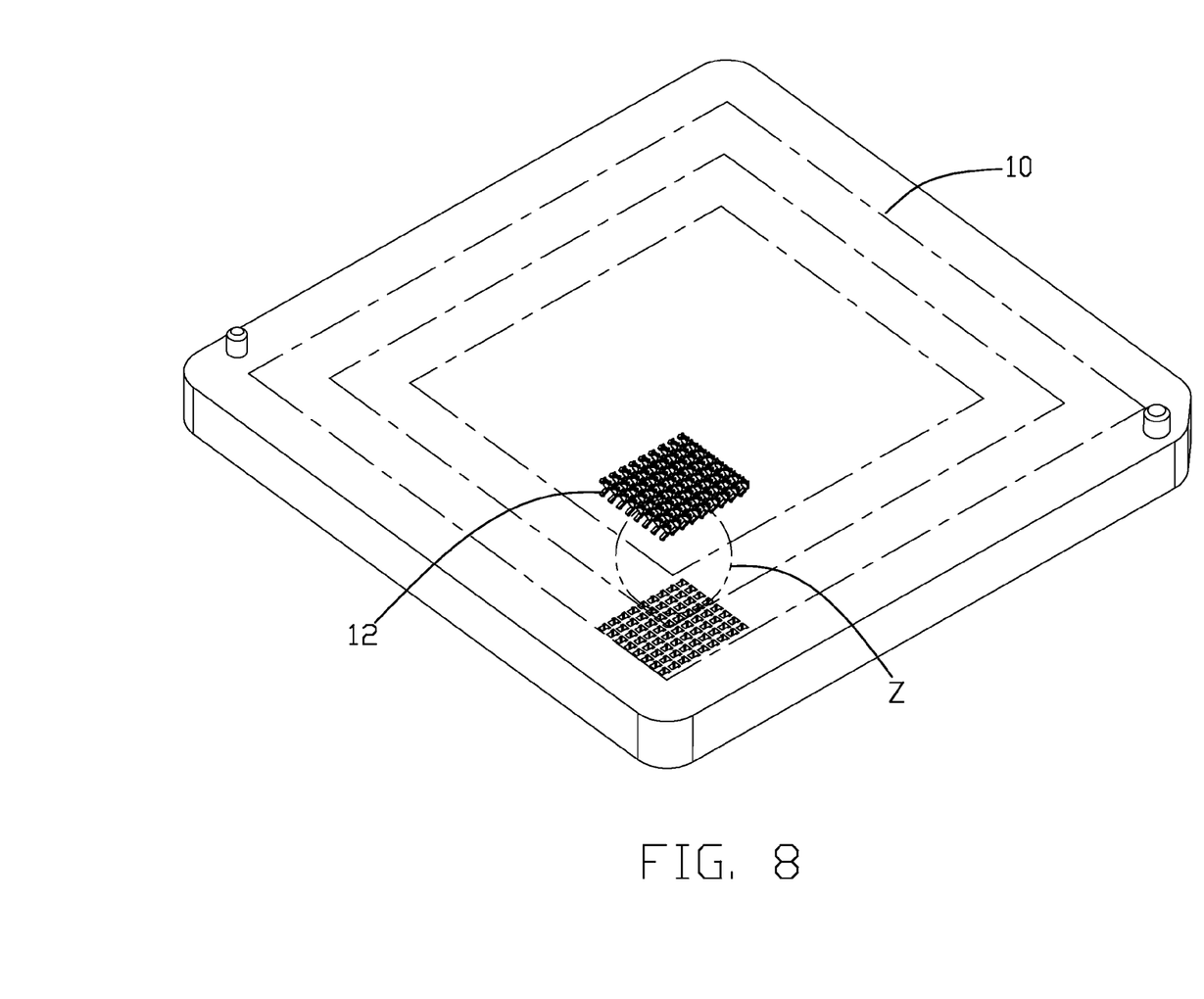
FIG. 8 is partial view of the insulative housing without contacts therein.

The contact 12 comprises a mother contact 12a and a first child contacts 12b juxtaposed under the mother contact terminal 12a. The mother contact 12a comprises a first base portion 120 having a first retaining portion 1200 for securing the contact 12 in the passageway 100. The first base portion 120 is generally of a plate-like shape. A first resilient arm 1202 extends upwardly from a top portion of the first base portion 120, and a third resilient arm 1204 extends downwardly from a lower portion of the first base portion 120. In special, the first resilient arm 1202 and third resilient arm 1204 are symmetrically disposed with respect to the first base portion 120. The first retaining portion 1200 is number of tabs symmetrically disposed at opposed sides of the first base portion 120. The first resilient arm 1202 and third resilient arm 1204 define a curved shape first contacting portion 1206, second contacting portion 1208 at a free end thereof, respectively.

The child contact 12c juxtaposed under the mother contact terminal 12a comprises a second base portion 122 having a second retaining portion 1220 for engaging with the passageway 100, a second resilient arm 1222 extending upwardly from a top portion of the second base portion 122, and a fourth resilient arm 1224 extending downwardly from a lower portion of the second base portion 122. Similarly, the second resilient arm 1222 and fourth resilient arm 1224 are symmetrically disposed with respect to the second base portion 122. The second retaining portion 1220 is number of tabs symmetrically disposed at opposed sides of the second base portion 122. The second base portion 122 and the second resilient arm 1222 will be attached to the first base portion 120 and the first resilient arm 1202, respectively, from a lower position. By the way, the contact 12 may be achieved. The first base portion 120 and second base portion 122 may have a completely same structure. The free end of the second resilient arm 1222 extends not beyond the free end of the first resilient arm 1202. Similarly, the free end of the fourth resilient arm 1224 extends not beyond the free end of the third resilient arm 1204. After the contact 12 is assembled, the first resilient arm 1202 and second resilient arm 1222 are overlapped in a vertical direction.

As an alternative, the contact 12 further comprises a second child contacts 12b juxtaposed under the mother contact terminal 12a. The child contacts 12b comprises a third base portion 124 disposed between the first base portion 120 and second base portions 122, a fifth resilient arm 1242 extending upwardly from an upper end of the third base portion 124 and disposed between the first resilient arm 1202 and second resilient arm 1222, and a sixth resilient arm 1244 extending downwardly from a lower end of the third base portion 124 and disposed between the third resilient arm 1204 and fourth resilient arm 1224. In this embodiment, the second resilient arm 1222 has a same structure as the fifth resilient arm 1242 and the fourth resilient 1224 arm has a same structure as the sixth resilient arm 1244. The third base portion 124 does not have a retaining portion thereon.

Figure 9:
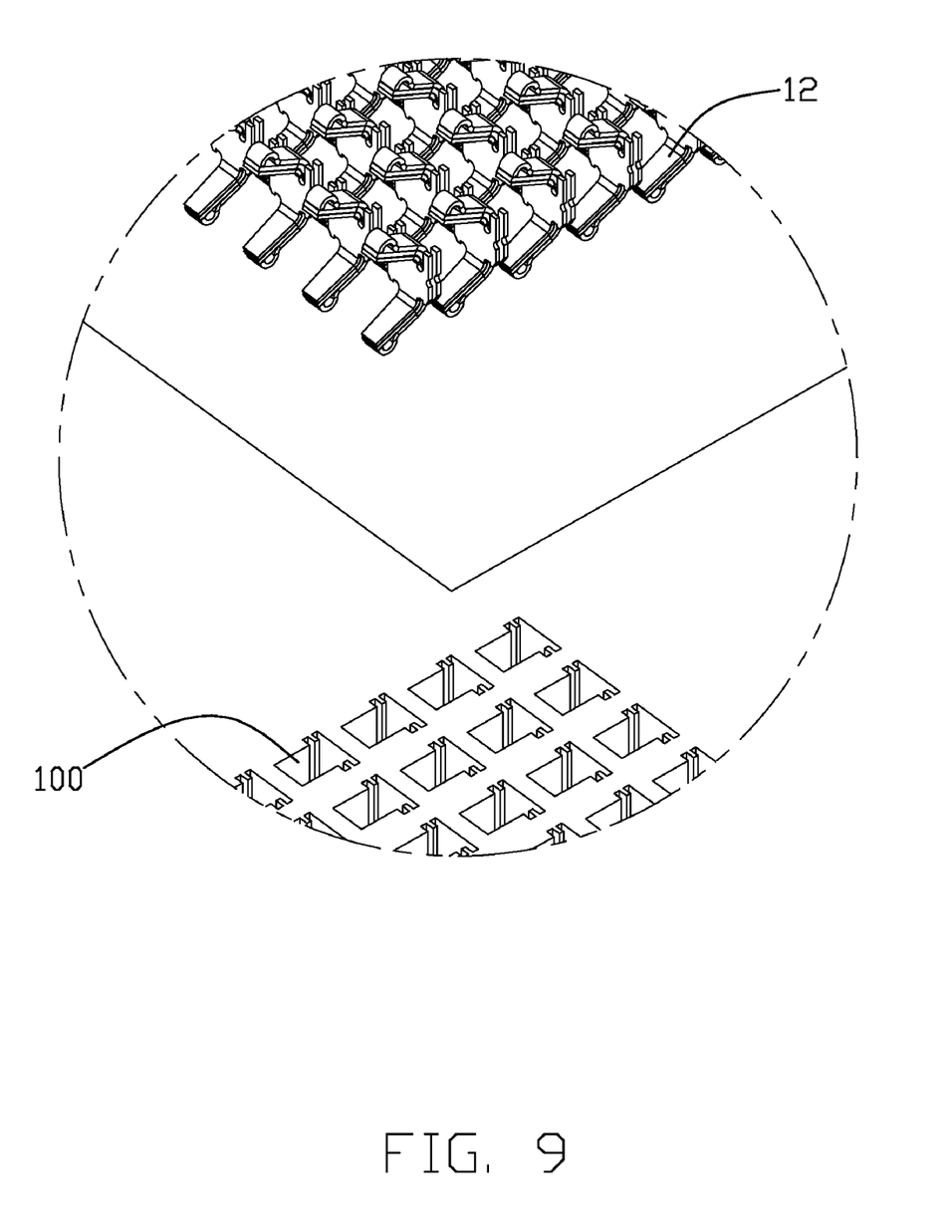
FIG. 9 is an enlarged view of the Z portion of FIG. 8.

Referring to FIG. 9, The passageway 100 for receiving the contact 12 comprises a narrow part and a wider part communicating with the narrow part, for receiving the first base portion 120, second base portion 122 and the resilient arms 1202, 1222, respectively. The third base portion 124 is sandwiched between the first base portion 120 and second base portion 122. Because both the first base portion 120 and second base portion 122 have retaining portions, accordingly, the third base portion 124 does not need retaining portion necessarily. Opposite sides of the first base portion 120 and second base portion 122 interferingly engage with inner walls of the narrow part of the passageway 100.

The contact 12 for using in the electrical connector 1 has a multilayer structure. The base portion comprises at least two layers (the first base portion 120, second base portion 122) overlapped and detachable from each other. It is noted that, the third base portion 124 is not a necessary component but will improve the capability of the contact 12. Likewise, both the upward resilient arm and downward resilient arm have a multilayer structure, respectively. By way of forgoing, the contact 12 will maintain a sufficient normal force even size reduced. Accordingly, an electrical connector with a large array pattern of the contacts 12 is achieved under a condition that elasticity and strength of the contact is enough. Thus, steady electrical connection is provided.

Figure 10:
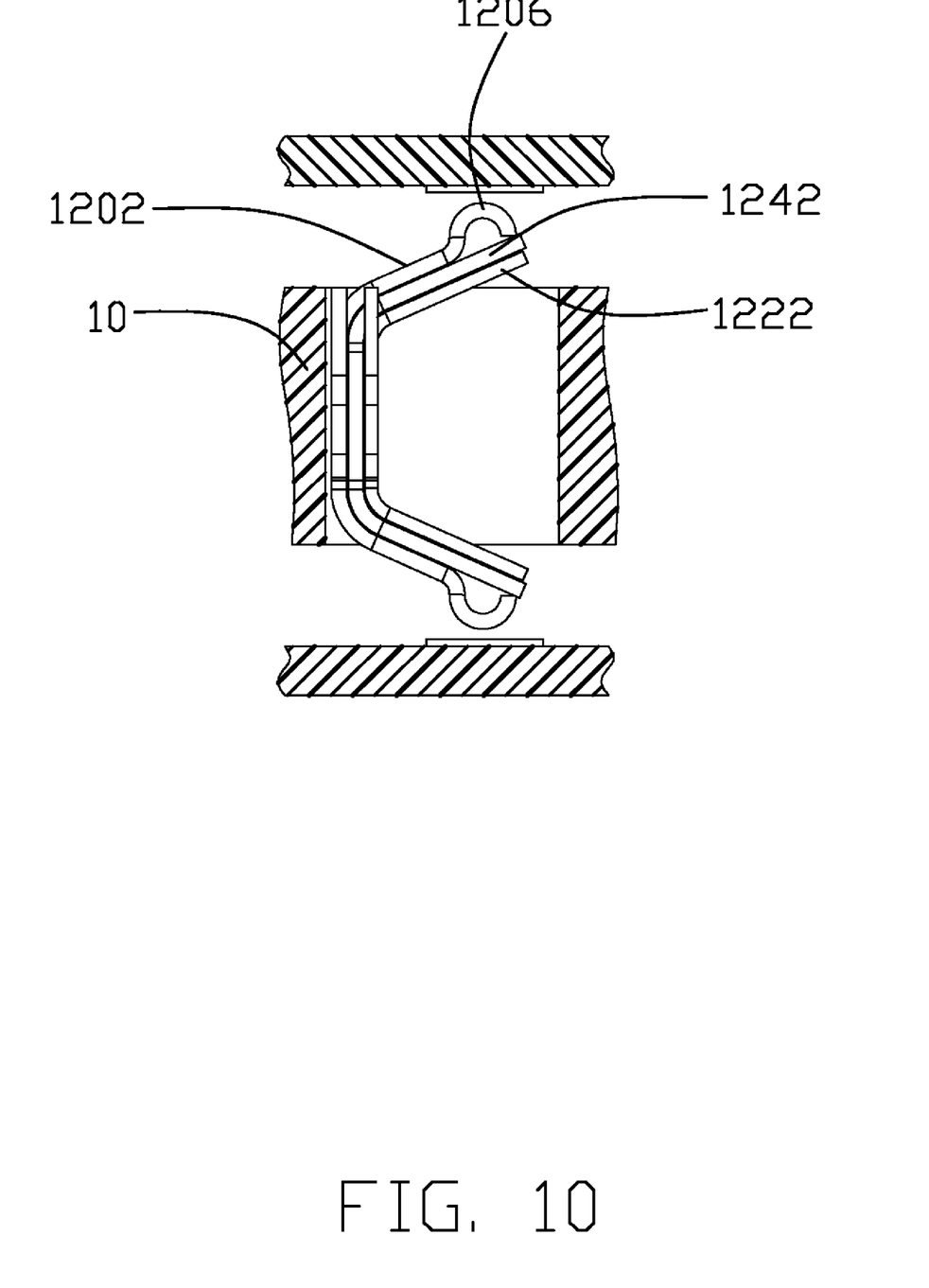
FIG. 10 is a section view of the electrical connector.
Figure 11:
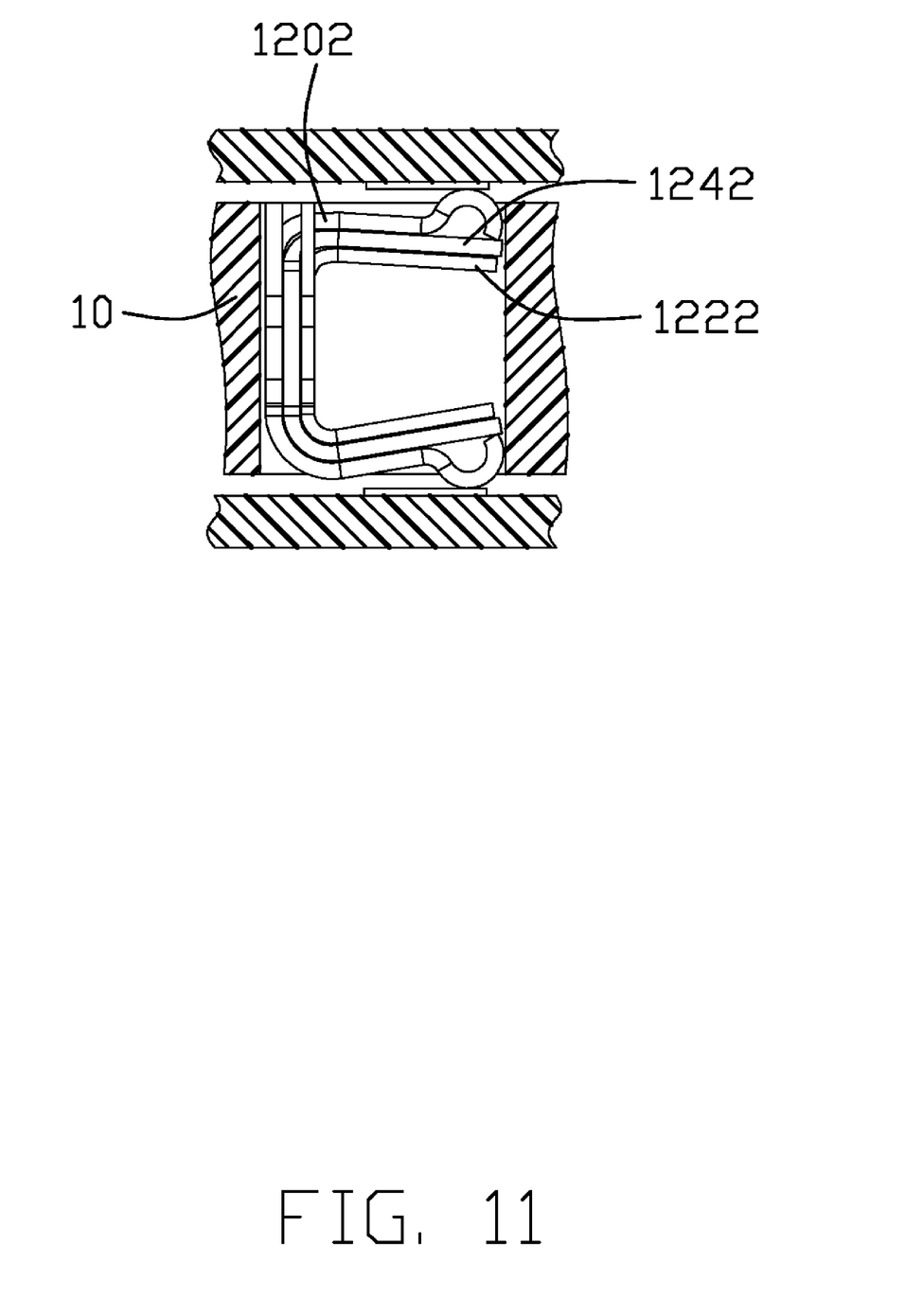
FIG. 11 is a section view of the electrical connector, wherein the contact is deformed under external force.

Referring to FIG. 10, the connector is ready to connect with a package and a PCB. Referring to FIG. 11, when the package is pushed toward the connector, the electrical contact 12 is deformed under force. Due to the contact 12 has a multilayer structure; the arm of the contact 12 will provide enough elasticity and strength under a condition that size of the contact 12 is reduced.

While the preferred embodiment in accordance with the present invention has been shown and described, equivalent modifications and changes known to persons skilled in the art according to the spirit of the present invention are considered within the scope of the present invention as defined in the appended claims.

What is claimed is:

1. An electrical connector comprising:
   an insulative housing having a plurality of passageways;
   a number of contacts received in corresponding passageways, respectively;
   each of the contacts comprising:
   a first base portion having a first retaining portion for securing the contact in the passageway, and a first resilient arm extending upwardly from said first base portion and having a contacting portion disposed at a free end thereof;
   a second base portion having a second resilient arm extending therefrom; and
   wherein the first resilient arm is substantially supported by the second resilient arm when the first resilient arm is displaced downwardly;
   wherein the first and second resilient arms are overlapped obliquely with respect to the first and second base portions, and the first and second base portions are overlapped in a vertical direction;
   wherein the first retaining portion is a number of tabs symmetrically disposed at opposed sides of the first base portion;
   wherein the first base portion further defines a third resilient arm with a contacting portion at a free end extending downwardly from a lower portion of the first base portion;
   wherein the first and third resilient arms are symmetrically disposed with respect to the first base portion;
   wherein a fourth resilient arm extends downwardly from a lower portion of the second base portion and is attached to the third resilient arm; and
   wherein the second and fourth resilient arms are symmetrically disposed with respect to the second base portion.

2. The electrical connector as claimed in claim 1, wherein the second base portion further defines a second retaining portion for engaging with the passageway.

3. The electrical connector as claimed in claim 2, wherein free end of the second resilient arm extends not beyond the free end of the first resilient arm.

4. The electrical connector as claimed in claim 3, wherein the contacting portion of the first resilient arm is of a curved shape, which extends upwardly along a direction of away from the second resilient arm.

5. The electrical connector as claimed in claim 2, wherein the passageway defines a narrow part and a wider part communicating with the narrow part, for receiving the base portions and resilient arms, respectively.

6. The electrical connector as claimed in claim 5, wherein opposite sides of the first and second base portions interferingly engage with inner walls of the wider part of the passageway.

7. An electrical connector comprising:
   an insulative housing defining a plurality of passageways between opposite upper and lower surfaces;
   a plurality of contact sets disposed in the corresponding passageways, respectively;
   each of said contact sets including:
   a first contact having a retention section retained to the housing, and one first spring arm extending from one end of the retention section obliquely beyond the corresponding one of said upper and lower surfaces for engagement with corresponding one electronic component under condition that the first retention section cooperate with said first spring arm to define a space, a second contact having a base section, and one second spring arm extending from one end of the base obliquely; wherein said second contact is received in said space and intimately contacts the first contact under condition that the base abuts against the retention section, and the second spring arm abut against the corresponding first spring arm so as to reinforce resiliency of said first spring arm;

further including a third contact including another retention section, and third spring arm extending from one end of said another retention section, wherein said third contact cooperates with said first contact to sandwich said second contact therebetween under condition that said another retention section abuts against the base section, and the third spring arm abuts against the second spring arm to reinforce resiliencies of said second spring arm; wherein the first contact, the second contact and the third contact are discrete from one another, the second contact is not directly retained to the housing but via being sandwiched between the first contact and the third contact both of which are directly retained to the housing, and only the first spring arm is adapted to contact the electronic component while the second spring arm and the third spring arm are not adapted to contact the electronic component; wherein the first contact further has another first spring arm extending from another end of the retention section, the second contact has another second spring arm extending from another end the base section, and the third contact further has another third spring arm extending from another end of said another retention section; wherein said another first spring arm cooperates with said another third spring arm to sandwich said another second spring arm, and said another first spring arm is adapted to contact another electronic component which is located around the other of the upper and lower surfaces while both said another second spring arm and said another third spring arm are not adapted to contact said another electronic component; and wherein the retention section, the base section and the another retention section are overlapped in a vertical direction.

8. The electrical connector as claimed in claim 7, wherein said retention section and said another retention section are respectively received in spaced first and second slots in the corresponding passageway.

9. The electrical connector as claimed in claim 7, wherein said first contact and said second contact are discrete from but intimately engaged with each other.

\* \* \* \* \*